United States Patent
Segura et al.

(10) Patent No.: US 7,053,449 B2
(45) Date of Patent: May 30, 2006

(54) DOUBLE GATE TRANSISTOR FOR LOW POWER CIRCUITS

(75) Inventors: Jaume A. Segura, Palma de Mallorca (ES); Ali Keshavarzi, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 10/254,346

(22) Filed: Sep. 24, 2002

(65) Prior Publication Data

US 2004/0056305 A1 Mar. 25, 2004

(51) Int. Cl.
*H01L 29/76* (2006.01)
(52) U.S. Cl. ........................ 257/340; 257/315; 257/341
(58) Field of Classification Search ................ 257/270, 257/331, 368, 385, 906, 912, 314–326, 168, 257/365, 406, 412; 38/157, 257
See application file for complete search history.

(56) References Cited

U.S. PATENT DOCUMENTS

| | | | |
|---|---|---|---|
| 5,619,454 A * | 4/1997 | Lee et al. ................ | 365/185.3 |
| 5,627,392 A | 5/1997 | Diorio et al. | |
| 6,115,291 A * | 9/2000 | Lakhani .................. | 365/185.3 |
| 6,122,191 A * | 9/2000 | Hirose et al. .......... | 365/185.01 |
| 6,462,990 B1 * | 10/2002 | Keeney ................. | 365/185.29 |
| 6,711,065 B1 * | 3/2004 | Shum et al. ........... | 365/185.29 |
| 6,768,165 B1 * | 7/2004 | Eitan ...................... | 257/324 |

OTHER PUBLICATIONS

Donald G. Fink and John M. Carroll, "Standard Handbook for Electrical Engineers," McGraw Hill Book Co., New York (1968), p. 2-30.*
Diorio, C. et al., "A Single-Transistor Silicon Synapse", IEEE Transactions on Electron Devices, vol. 43, No. 11, pp. 1972-1980, Nov. 1996.
Diorio, C. et al., "Adaptive CMOS: From Biological Inspiration to Systems-on-a-Chip", Proceedings of the IEEE, vol. 90, No. 3, pp. 345-357, Mar. 2002.
*AMD Finds Way to Double Power*, San Jose Mercury News, Sep. 11, 2002, Business Section, p. 1.

* cited by examiner

*Primary Examiner*—Ori Nadav
(74) *Attorney, Agent, or Firm*—Jeffrey B. Huter

(57) ABSTRACT

A double gate MOSFET having a control gate and a signal gate. The effective threshold voltage seen by the signal gate may be modified by charging the control gate. The effective threshold voltage may be increased in magnitude to reduce sub-threshold leakage current when the double gate MOSFET is inactive. When inactive, the control gate is maintained at a negative voltage for a double gate nMOSFET, and is maintained at a positive voltage for a double gate pMOSFET. When active, the control gate is charged to a voltage close to the threshold voltage, and then floated, so that a signal voltage applied to the signal gate may turn the double gate MOSFET ON during a signal voltage transition via the coupling capacitance between the signal and control gates.

6 Claims, 6 Drawing Sheets

DOUBLE GATE TRANSISTOR FOR LOW POWER CIRCUITS

FIELD

Embodiments of the present invention relate to circuits, and more particularly, to transistors with double gates for reducing sub-threshold leakage current.

BACKGROUND

Consider a computer system, such as that illustrated in FIG. 1. In FIG. 1, microprocessor 102 comprises many sub-blocks, such as arithmetic logic unit (ALU) 104 and on-chip cache 106. Microprocessor 102 may also communicate to other levels of cache, such as off-chip cache 108. Higher memory hierarchy levels, such as system memory 110, are accessed via host bus 112 and chipset 114. In addition, other off-chip functional units, such as graphics accelerator 116 and network interface controller (NIC) 118, to name just a few, may communicate with microprocessor 102 via appropriate busses or ports.

As device technology scales to smaller dimensions, transistor threshold voltage is expected to decrease in magnitude so as to provide constant electric field scaling. A smaller threshold voltage may lead to an increase in sub-threshold leakage current. For many circuits, such as logic stages or register files in microprocessor 102, sub-threshold leakage current may cause unwanted power dissipation, reduced noise robustness, and slower performance.

Various techniques have been proposed and used to control leakage current, such as modifying the transistor threshold voltage. In some cases, transistor threshold voltage is modified directly through process technology by incorporating a set of devices having different threshold voltages, or by making the device body terminal of a transistor accessible so that its threshold voltage may be controlled by applying a body bias voltage. However, the former technique presently has the limitation that the transistor threshold voltage cannot be dynamically changed for a given transistor once the integrated circuit has been fabricated. The latter technique, although more flexible than the former, presently has the limitation of a relatively large body terminal capacitance, which may lead to a substantial increase in the number of clock cycles needed to change the threshold voltage of the devices.

DESCRIPTION OF EMBODIMENTS

Figure 1:
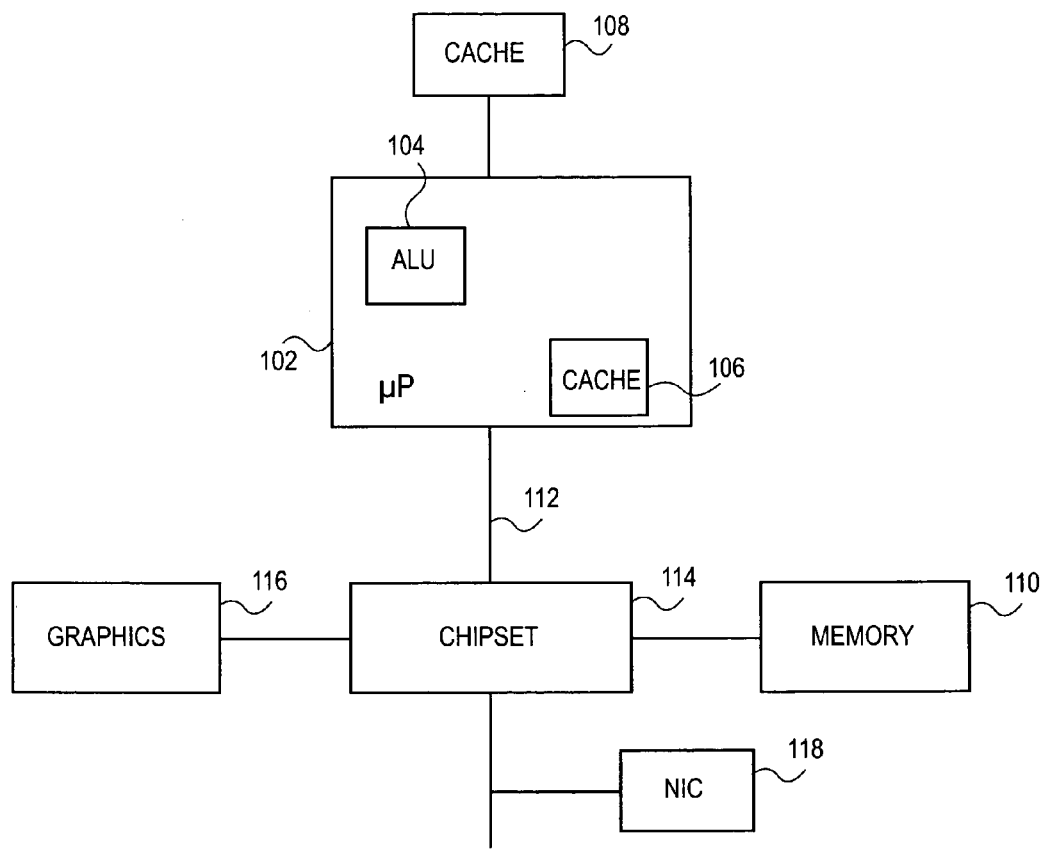
FIG. 1 is a high-level architecture for a computer system.
Figure 2:
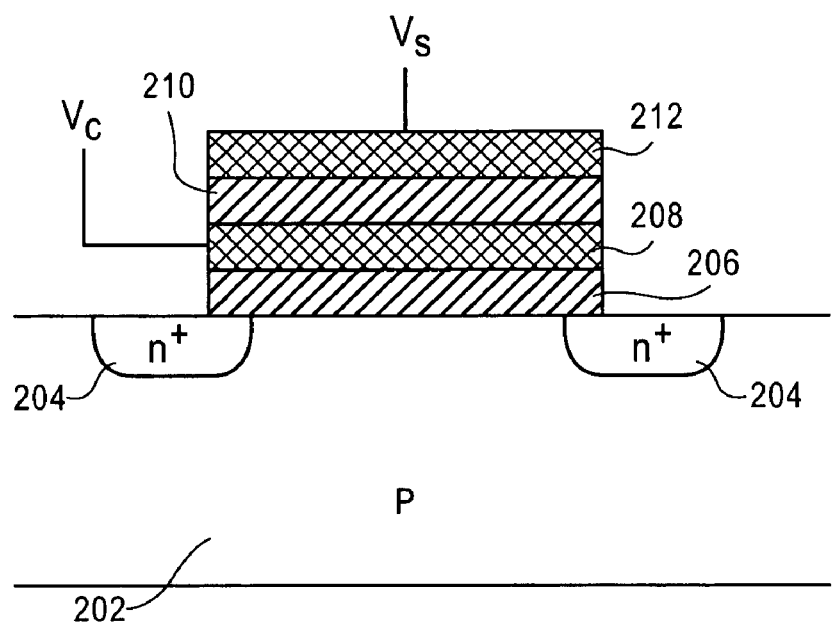
FIG. 2 is a cross-sectional view of a double gate nMOSFET according to an embodiment of the present invention.

A cross-sectional view of a nMOSFET (n-Metal Oxide Semiconductor Field Effect Transistor) according to an embodiment of the present invention is provided in FIG. 2. Features in FIG. 2 similar to typical nMOSFETs need not be explained in any great detail to understand the embodiments, and are only briefly summarized herein. Formed in p-substrate 202 are source/drain regions 204. As is well-known, source/drain regions 204 are relatively highly doped regions having a n-carrier type conductivity, and may be formed by any well-known process technology. Insulating layer 206, such as for example silicon dioxide, is formed over p-substrate 202 to overlap respective portions of source/drain regions 204 as indicated in FIG. 2. Insulating layer 206 may be formed by any well-known process technology. Gate 208 is formed on insulating layer 206 by any well-known technique, and may comprise, for example, polysilicon. The embodiment of FIG. 2 further includes insulating layer 210 formed on gate 208, and gate 212 formed on insulating layer 210. Insulating layer 210 and gate 212 may be formed by any well-known process technology, and may comprise, respectively, silicon dioxide and polysilicon, as an example.

The structure shown in FIG. 2 may be termed a double gate nMOSFET. Gate 208, the gate closest to the n-channel formed between n+regions 204 during device operation, may be termed a control gate. Gate 212 may be termed a signal gate. Embodiments may utilize the double gate nMOSFET of FIG. 2 in which a control voltage, denoted as $V_C$, is applied to control gate 208, and a signal voltage, denoted as $V_S$, is applied to signal gate 212. The double gate nMOSFET of FIG. 2 may be fabricated such that the capacitance between the signal and control gates is twice the capacitance between the control gate and the n-channel formed between n+regions 204 during device operation. However, other embodiments may have different ratios of capacitances.

The control voltage may be used to lower or increase the effective threshold voltage, i.e., the threshold voltage seen by the signal voltage applied to signal gate 212. Increasing the effective threshold voltage reduces sub-threshold leakage current, other variables being held constant. For example, when the device is not active, the control voltage may be set to a negative voltage (with respect to p substrate 202) to raise the effective threshold voltage seen by signal gate 212 so that sub-threshold leakage current is reduced. The magnitude of the negative control voltage may be limited by GIDL (Gate Induced Drain Leakage).

When the device is expected to be active, the control voltage is set to the threshold voltage of the device, or perhaps to a voltage very close to but less than the threshold voltage, after which control gate 208 may be left floating (a high impedance state). The control voltage applied to control gate 208 and the signal voltage applied to signal gate 212 both contribute to the electric field available for inverting the p region between n+regions 204 into a n-channel. As a result, when the control gate has been charged to a voltage close to the threshold voltage, a positive going change in the signal voltage applied to signal gate 212 may turn ON the device. For example, if the threshold voltage is $(\frac{1}{3})V_{dd}$ and the capacitance between the signal and control gates is twice the capacitance between the control gate and the channel, then it is expected that if the signal gate makes a transition from 0 to $V_{dd}$, then the capacitive coupling between the signal and control gates sets the floating control gate close to $V_{dd}$, thereby fully turning ON the device. It is expected that embodiments of the present invention provide for the modulation of the effective transistor threshold voltage through a wide range of values, where the threshold voltage may be changed in one clock period.

Figure 3:
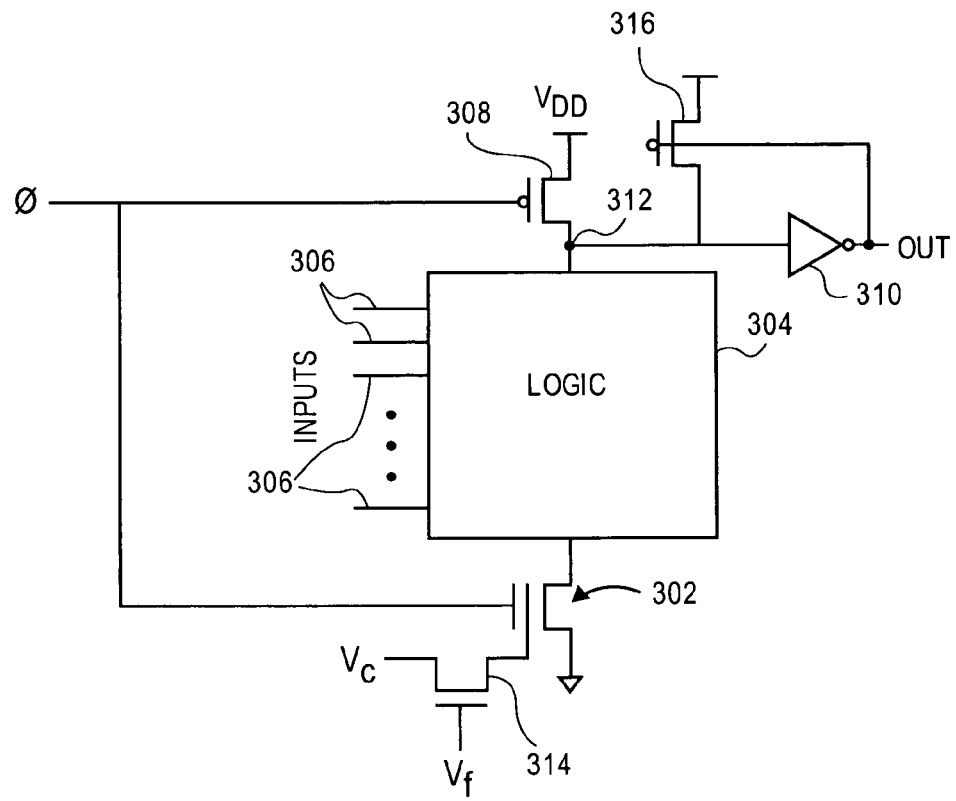
FIG. 3 is a circuit application of the double gate nMOSFET of FIG. 2 according to an embodiment of the present invention.

The double gate nMOSFET of FIG. 2 may find utility in logic applications that require high performance and low power. FIG. 3 illustrates a circuit application of a double gate nMOSFET in a CMOS (Complementary Metal Oxide Semiconductor) dynamic gate. Double gate nMOSFET 302 is used to control sub-threshold leakage current for the entire dynamic gate in FIG. 3. Logic 304 comprises a plurality of nMOSFETs (not shown) to synthesize a logic function, where input ports 306 are connected to various gates of the nMOSFETs within logic 304. The clock signal is denoted by ϕ, and is HIGH ($V_{dd}$) during an evaluation phase and LOW ($V_{ss}$) during a pre-charge phase. The clock signal ϕ is applied to the gate of pullup pMOSFET 308 and to the signal gate of double gate nMOSFET 302. The output is taken at the output port of inverter 310.

When the dynamic gate is to be put into an active mode, pass nMOSFET 314 is switched ON by bringing its gate voltage, denoted by $V_f$, to HIGH, and the control voltage $V_c$ is set close to or substantially equal to the transistor threshold voltage (of nMOSFET 302). When the control gate of double gate nMOSFET 302 has been charged to $V_c$, pass nMOSFET 314 is switched OFF so that the control gate is floating. The dynamic gate is now in its active mode. During a pre-charge phase, double gate nMOSFET 302 is OFF and pullup pMOSFET 308 charges node 312 HIGH. During an evaluation phase, double gate nMOSFET 302 is ON, pullup pMOSFET 308 is OFF, and logic 304 conditionally pulls node 312 LOW depending upon the input voltages at input ports 306. A half keeper comprising pullup pMOSFET 316 and inverter 310 keeps node 312 HIGH during an evaluation phase if it is not pulled LOW by logic 304. (In other embodiments, a transmission gate may be used in place of pass nMOSFET 314.)

When the dynamic gate is to be put into an inactive mode, pass nMOSFET 314 is switched ON by bringing its gate voltage $V_f$ HIGH, and the control voltage $V_c$ is set to a negative voltage. With the control gate of double gate nMOSFET 302 maintained at a negative voltage, the sub-threshold leakage current may be significantly reduced, depending upon the magnitude of $V_c$.

Figure 4:
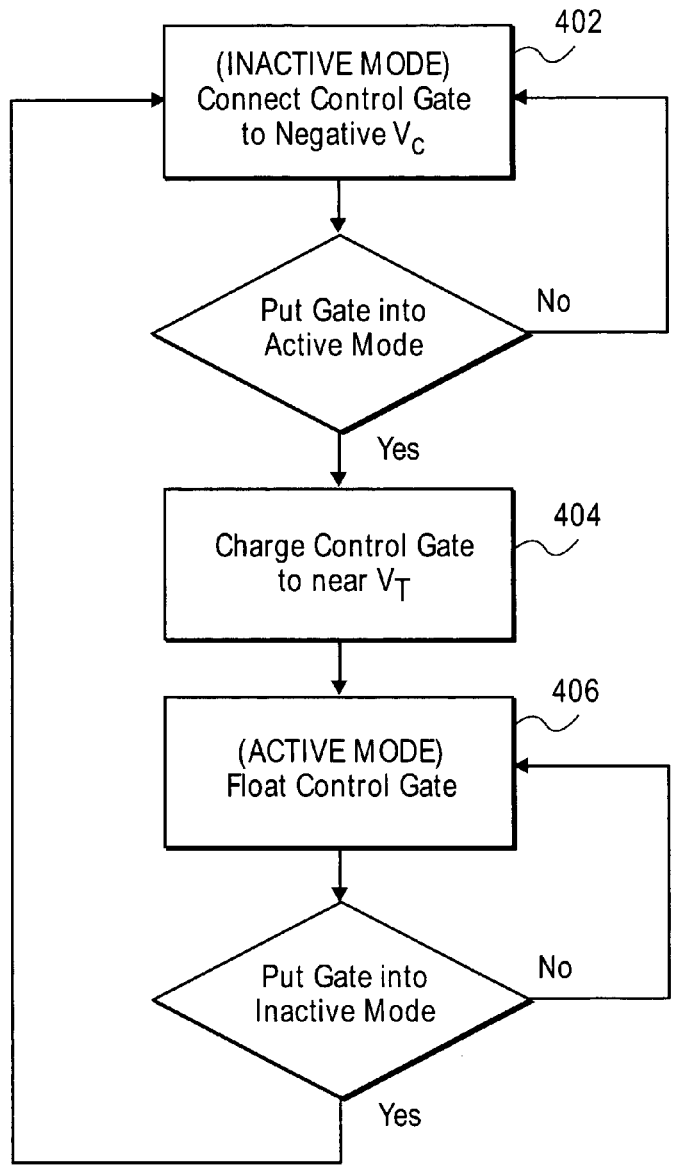
FIG. 4 is a state diagram illustrating the active and inactive modes of a logic gate utilizing a double gate nMOSFET.

A state diagram representing the above utilization of a double gate nMOSFET in an arbitrary logic gate is illustrated in FIG. 4. Assume that initially the logic gate is in an inactive mode in block 402. While in an inactive mode, the control gate is maintained at a negative voltage. If the logic gate is to be put into an active mode, the control gate is charged to the threshold voltage, denoted by $V_T$, in block 404, and then the control gate is floated in block 406. If the logic gate is to be put back into the inactive mode, the control gate is again connected to a negative voltage.

Figure 5:
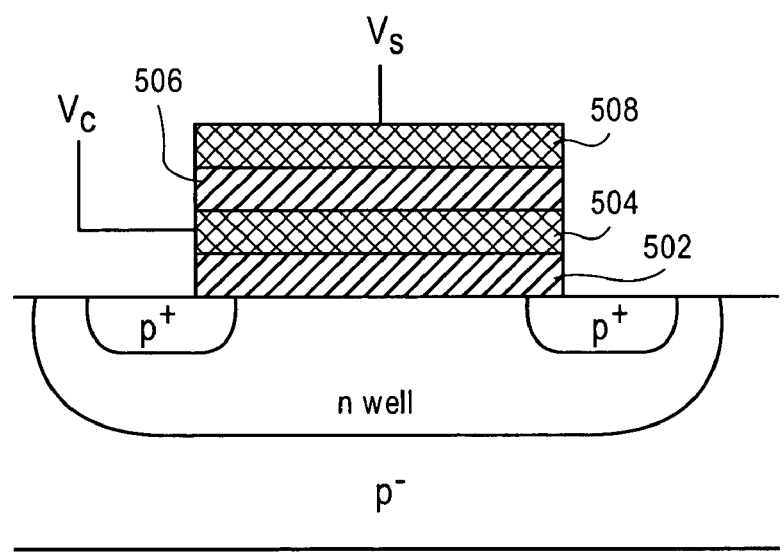
FIG. 5 is a cross-sectional view of a double gate pMOSFET according to an embodiment of the present invention.
Figure 6:
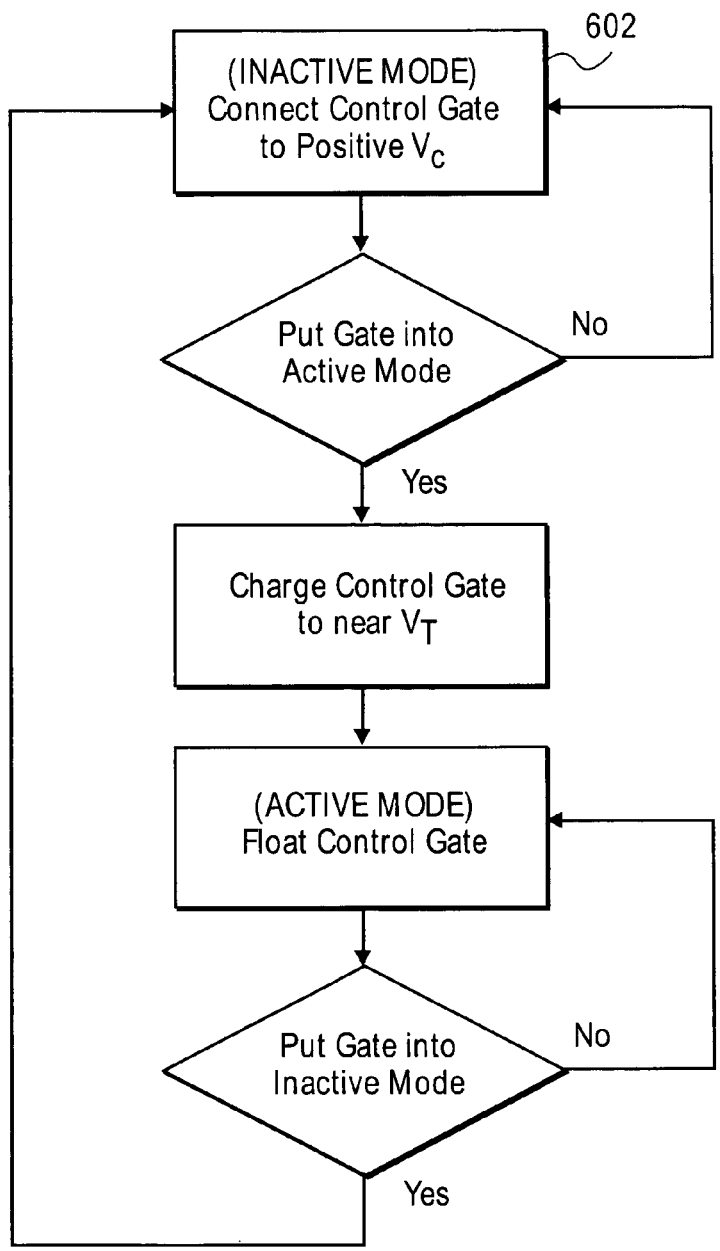
FIG. 6 is a state diagram illustrating the active and inactive modes of a logic gate utilizing a double gate pMOSFET.

Embodiments are not limited to the dynamic gate of FIG. 3. Static logic may employ double gate transistors to reduce sub-threshold leakage current. Furthermore, embodiments may be realized by utilizing other IGFET (Insulated Gate FET) devices. For example, a double gate pMOSFET is illustrated in FIG. 5. Gate oxides 502 and 506, control gate 504, and signal gate 508 are formed in similar fashion as for the double gate nMOSFET of FIG. 2. However, the algebraic signs of the control voltage and signal voltage are opposite the respective voltages for the double gate nMOSFET. This is illustrated in the state diagram of FIG. 6, where in block 602, the control gate is connected to a positive control voltage $V_c$ when the logic gate is in its inactive mode. In this case, the threshold voltage $V_T$ is negative.

Various modifications may be made to the disclosed embodiments without departing from the scope of the invention as claimed below.

The invention claimed is:

1. A method to reduce sub-threshold leakage current in a circuit, the circuit having an active mode, an inactive mode, and comprising a double gate nMOSFET, the double gate nMOSFET comprising a control gate, the method comprising:

charging the control gate to a negative voltage to place the circuit in the inactive mode;

charging the control gate of the double gate nMOSFET to a positive voltage followed by floating the control gate to place the circuit in the active mode, the double gate nMOSFET comprising a signal gate and a substrate, the double gate nMOSFET having a first coupling capacitance between the substrate and the control gate, and having a second coupling capacitance between the signal gate and the control gate, wherein the second coupling capacitance is at least twice the first coupling capacitance.

2. The method as set forth in claim 1, the double gate nMOSFET having a threshold voltage, where the positive voltage is at least in magnitude equal to the threshold voltage.

3. The method of claim 1, further comprising applying a positive signal voltage to the signal gate of the double gate nMOSFET to turn on the double gate nMOSFET after placing the double gate nMOSFET in the active mode.

4. A method to reduce sub-threshold leakage current in a circuit, the circuit having an active mode, an inactive mode, and comprising a double gate pMOSFET, the double gate pMOSFET comprising a control gate, the method comprising:

charging the control gate to a positive voltage to place the circuit in the inactive mode; and charging the control gate of the double gate pMOSFET to a negative voltage followed by floating the control gate to place the circuit in the active mode, the double gate pMOSFET comprising a signal gate and a substrate, the double gate pMOSFET having a first coupling capacitance between the substrate and the control gate, and having a second coupling capacitance between the signal gate and the control gate, wherein the second coupling capacitance is at least twice the first coupling capacitance.

5. The method as set forth in claim 4, the double gate pMOSFET having a threshold voltage, where the negative voltage is at least in magnitude equal to the threshold voltage.

6. The method of claim 4, further comprising applying a negative signal voltage to the signal gate of the double gate pMOSFET to turn on the double gate pMQSFET after placing the double gate pMOSFET in the active mode.

* * * * *